(12) United States Patent
Eroz et al.

(10) Patent No.: US 7,761,750 B2
(45) Date of Patent: *Jul. 20, 2010

(54) TURBO CODE INTERLEAVER WITH NEAR OPTIMAL PERFORMANCE

(75) Inventors: Mustafa Eroz, Germantown, MD (US); A. Roger Hammons, Jr., North Potomac, MD (US); Feng-Wen Sun, Germantown, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/980,916

(22) Filed: Oct. 31, 2007

(65) Prior Publication Data

US 2008/0059727 A1 Mar. 6, 2008

Related U.S. Application Data

(60) Continuation of application No. 11/051,585, filed on Mar. 30, 2005, now Pat. No. 7,526,687, which is a continuation of application No. 10/024,834, filed on Dec. 19, 2001, now Pat. No. 6,925,587, which is a division of application No. 09/375,067, filed on Aug. 16, 1999, now Pat. No. 6,334,197.

(60) Provisional application No. 60/096,807, filed on Aug. 17, 1998.

(51) Int. Cl.
*H03M 13/27* (2006.01)
*H03M 13/29* (2006.01)

(52) U.S. Cl. ...................... 714/701; 714/755

(58) Field of Classification Search ............... 714/701, 714/755
See application file for complete search history.

(56) References Cited

U.S. PATENT DOCUMENTS

| 5,063,533 | A | * | 11/1991 | Erhart et al. ............... 711/157 |
| 5,159,608 | A | | 10/1992 | Falconer et al. |
| 5,687,095 | A | | 11/1997 | Haskell et al. |
| 5,721,745 | A | | 2/1998 | Hladik et al. |
| 5,742,612 | A | | 4/1998 | Gourgue et al. |
| 5,751,725 | A | | 5/1998 | Chen |
| 5,761,249 | A | | 6/1998 | Ben-Efraim |
| 5,822,359 | A | * | 10/1998 | Bruckert et al. ............ 375/145 |

(Continued)

FOREIGN PATENT DOCUMENTS

DE 19520987 12/1996

(Continued)

OTHER PUBLICATIONS

Ho, Mark S.C. et al., "Improving the Constituent Codes of Turbo Encoders", IEEE Globecom 1998, Globecom 1998 The Bridge to Global Integration, Sydney, Nov. 8-12, 1998.

(Continued)

*Primary Examiner*—Stephen M Baker

(57) ABSTRACT

A method of interleaving blocks of indexed data of varying length is disclosed. The method includes the steps of: providing a set of basic Interleavers comprising a family of one or more permutations of the indexed data and having a variable length; selecting one of the basic Interleavers based upon a desired Interleaver length L; and adapting the selected basic Interleaver to produce an Interleaver having the desired Interleaver length L.

33 Claims, 5 Drawing Sheets

U.S. PATENT DOCUMENTS

| | | | |
|---|---|---|---|
| 5,859,840 A * | 1/1999 | Tiedemann et al. | 370/335 |
| 5,881,093 A | 3/1999 | Wang et al. | |
| 5,907,582 A | 5/1999 | Yi | |
| 5,910,182 A | 6/1999 | Dent et al. | |
| 5,944,850 A | 8/1999 | Chouly et al. | |
| 5,970,085 A | 10/1999 | Yi | |
| 5,978,414 A | 11/1999 | Nara | |
| 5,983,384 A | 11/1999 | Ross | |
| 5,987,057 A | 11/1999 | Smith et al. | |
| 5,996,104 A | 11/1999 | Herzberg | |
| 6,023,783 A | 2/2000 | Divsalar et al. | |
| 6,088,387 A | 7/2000 | Gelblum et al. | |
| 6,094,427 A | 7/2000 | Yi | |
| 6,289,486 B1 | 9/2001 | Lee et al. | |
| 6,332,209 B1 | 12/2001 | Eroz et al. | |
| 6,339,834 B1 | 1/2002 | Crozier et al. | |
| 6,347,385 B1 | 2/2002 | Cui et al. | |
| 6,370,669 B1 | 4/2002 | Eroz et al. | |
| 6,430,722 B1 | 8/2002 | Eroz et al. | |
| 6,519,732 B1 | 2/2003 | Li | |
| 6,530,059 B1 | 3/2003 | Crozier et al. | |
| 6,665,829 B2 | 12/2003 | Eroz et al. | |
| 6,925,587 B2 * | 8/2005 | Eroz et al. | 714/701 |
| 2002/0083395 A1 | 6/2002 | Eroz et al. | |
| 2002/1016609 | 11/2002 | Eroz et al. | |
| 2003/0041297 A1 | 2/2003 | Eroz et al. | |
| 2003/0051205 A1 | 3/2003 | Eroz et al. | |

FOREIGN PATENT DOCUMENTS

| | | |
|---|---|---|
| DE | 19736653 | 12/1998 |
| EP | 0300139 | 1/1989 |
| EP | 0952673 | 10/1999 |
| JP | 62-190932 | 8/1987 |
| JP | 7-202851 | 8/1995 |
| JP | 11-68734 | 3/1999 |
| WO | WO 96/37050 | 11/1996 |
| WO | WO 98/48517 | 10/1998 |
| WO | WO 99/07076 | 2/1999 |
| WO | WO 00/13323 | 3/2000 |
| WO | WO 00/41343 | 7/2000 |
| WO | WO 00/48353 | 8/2000 |

OTHER PUBLICATIONS

Anderson, J.D. et al., "Interleaver Design for Turbo Coding".

Divsalar, D. et al., "Multiple Turbo Codes", Proceedings of the Military Communications Conference (Milcom), San Diego, No. 6-8 1995, vol. 1, Nov. 6, 1995, Institute of Electrical and Electronics Engineers ISBN, XP-000580788.

Divsalar, D. et al., "Turbo Codes for PCS Applications", Jun. 18, 1995, pp. 54-59, XP-000532968.

Divsalar, D. et al., "Effective Free Distance of Turbo Codes", Electronics Letters, vol. 32, No. 5, Feb. 29, 1996, pp. 445-446.

Divsalar, D. et al., "On the Design of Turbo Codes", TDA Progress Report 42-123, Nov. 15, 1995, pp. 99-121.

Lee, Lin-Nan et al., "Turbo Code and Its Performance" T1A TR45.5.4, Dec. 8, 1997.

Lee, Lin-Nan et al., "Third Generation Wireless Technologies-Expectations and Realities", Ninth IEEE International Symposium on Personal, Indoor and Mobile Radio Communications (Cat. No. 98TH 8361), Proceedings of Ninth International Symposium on Personal, Indoor and Mobile Radio Communications (PIMRC '98), Boston, MA, USA, Sep. 8-11, 1998, pp. 79-83, vol. 1, 1998 New York, NY USA, IEEE USA ISBN.

Benedetto, S. at al., "Unveiling Turbo Codes: Some Results On Parallel Concatenated Coding Schemes", IEEE Transactions on Information Theory, vol. 42, No. 2, Mar. 1, 1996, pp. 409-428 XP-002057508.

Benedetto, S. et al., "Design of Parallel Concatenated Convolutional Codes", IEEE Transactions on Communication, vol. 44, No. 5, May 1996.

Benedetto, S. at al., "System Encoders for Convolutional Codes and Their Application to Turbo Codes", 0-7803-3336-5/96 IEEE, 1996. pp. 6-10.

Berrou et al., "Near Shannon Limit Error—Correcting Code and Decoding: Turbo Codes", May 23, 1993, pp. 1064-1070, XP-000371240.

Maric, "Class of Algebraically Constructed Permutations for Use in Pseudorandom Interleavers", Electronics Letters, vol. 30, No. 17, Aug. 18, 1994, pp. 1378-1379.

Eroz et al., "RTT Text for Turbo Codes", ETSI SMG2UMTS-L1 Oslo, Norway, Apr. 1, 1998.

Eroz et al., "FER and BER Comparisons of Turbo versus Convolutional Codes", ETSI SMG2UMTS-L1, Paris, France, Apr. 28, 1998.

Acikel, O.F. et al, "High Rate Turbo Codes for BPSK/QPSK Channels", ICC '98, 1998 IEEE International Conference on Communications, Jun. 7-11, 1998, pp. 422-427, vol. 1.

Riedel, S., "Symbol-by-Symbol Map Decoding Algorithm for High-Rate Convolutional Codes that Use Reciprocal Dual Codes", IEEE Journal on Selected Areas in Communications, Vo. 16, No. 2, Feb. 1, 1998, pp. 175-185.

Rowitch, D.N. et al., "Rate Compatible Punctured Turbo (RCPT) Codes in a Hybrid FEC/ARQ System", 1997 IEEE Global Telecommunications Mini-Conference, vol. 4, Nov. 1999, pp. 55-59.

Chan et al., "An Adaptive Hybrid FEC/ARQ Protocol Using Turbo Codes", 1997 IEEE 6th International Conference on Universal Personal Communications, Oct. 1997, pp. 541-545.

Barbulescu et al., "Rate Compatible Turbo Codes", Electronics Letters, vol. 31, No. 7, Mar. 30, 1995, pp. 535-536.

Lgic, "Puncturing Algorithm for Turbo", 3GPP/TSG/RAN/WG1#4, TDOC 338/99, Apr. 19-20, 1999, pp. 1-6, Yokohama, Japan, p. 1, line 1—p. 6, last line, fig. 2, XP-002184254.

Blackert et al., "An Upper Bound on Turbo Code Fee Distance", CC 1996, Jun. 1996, pp. 957-961.

Fei et al., "The Effects of Time Delay Spread on Turbo-TCM in a Wireless Communication Channel", 1997 IEEE 47th Vehicular Technology Conference, May 1997, pp. 334-338.

EPO Communication dated Sep. 5, 2007 in European counterpart application No. 99943715.5.

Japanese Office Communication dated Sep. 17, 2002 in Japanese counterpart application No. 2000-565610.

Korean Office Communication dated Feb. 28, 2002 in Korean counterpart application No. 10-2000-7004074.

Final Rejection dated Apr. 29, 2009 in U.S. Appl. No. 11/980,915, filed Oct. 31, 2007 by Mustafa Eroz et al.

Notice of Allowance dated Aug. 27, 2009 in U.S. Appl. No. 11/980,915, filed Oct. 31, 2007 by Mustafa Eroz et al.

* cited by examiner

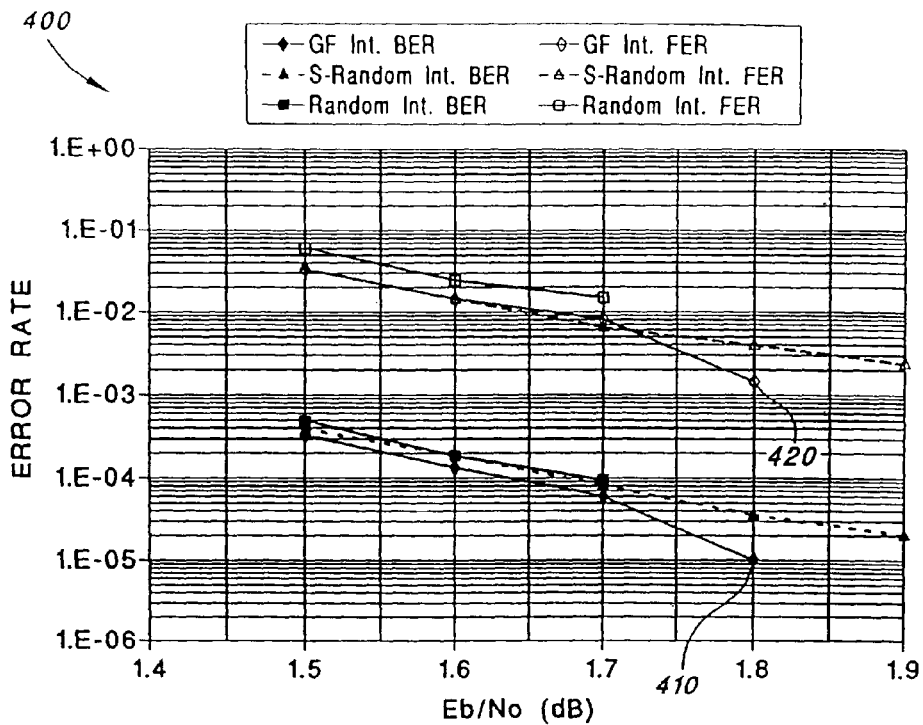
FIG. 4  Performance of Turbo Interleavers of Size: 1024, Code Rate: 1/2, Four Decoder Itereations
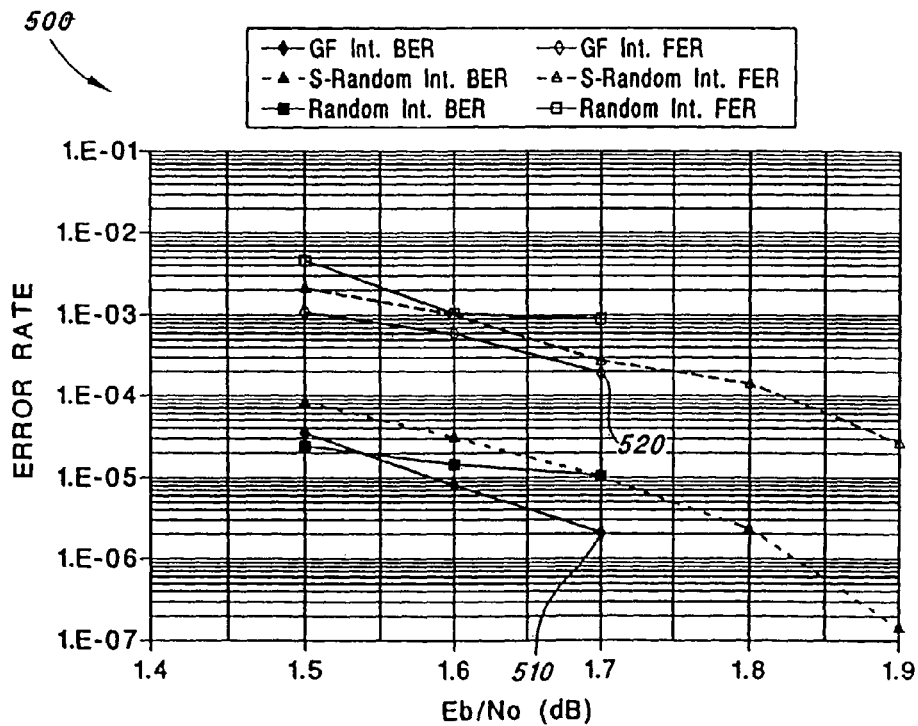
FIG. 5  Performance of Turbo Interleavers of Size: 1024, Code Rate: 1/2, Eight Decoder Itereations

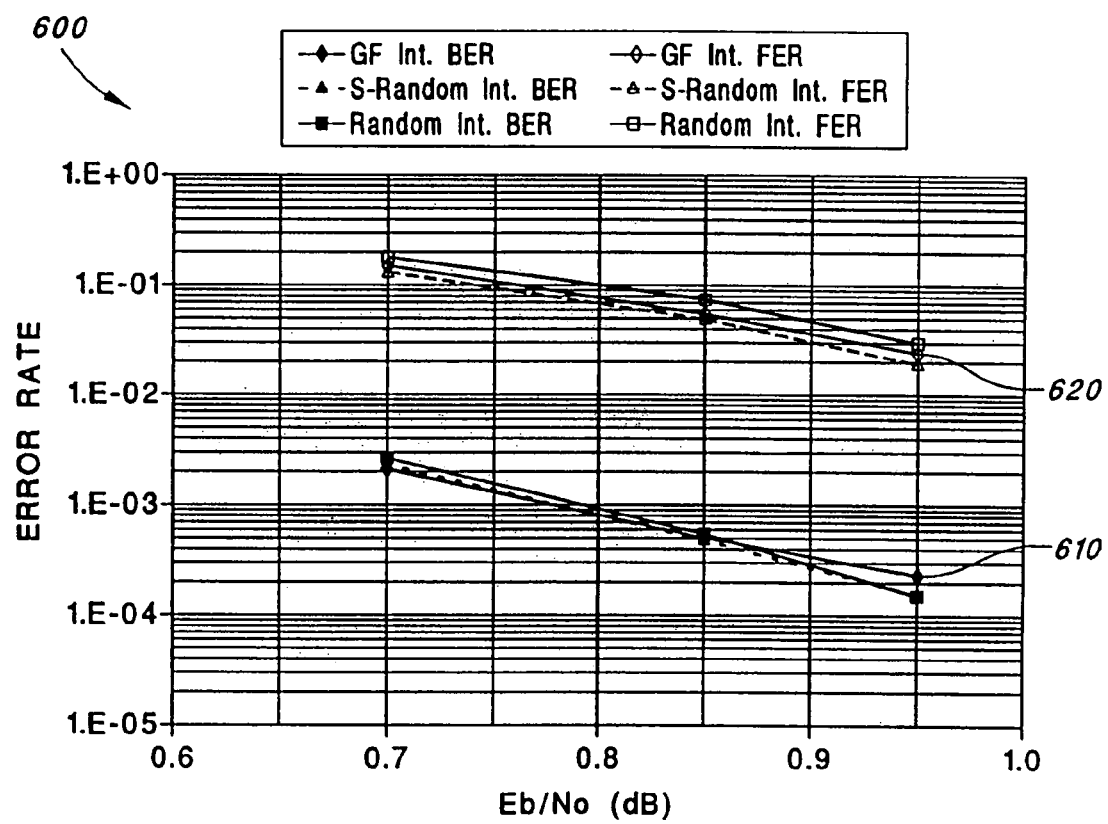
FIG. 6  Performance of Turbo Interleavers of Size: 1152, Code Rate: 1/3, Four Decoder Itereations

TURBO CODE INTERLEAVER WITH NEAR OPTIMAL PERFORMANCE

This application is a continuation of U.S. application Ser. No. 11/051,585, filed Mar. 30, 2005, now U.S. Pat. No. 7,526, 687, issued Apr. 28, 2009, entitled TURBO CODE INTERLEAVER WITH NEAR OPTIMAL PERFORMANCE, by Mustafa Eroz, et al., which is a continuation of U.S. application Ser. No. 10/024,834, filed Dec. 19, 2001, entitled TURBO CODE INTERLEAVER WITH NEAR OPTIMAL PERFORMANCE, by Mustafa Eroz, et al., now U.S. Pat. No. 6,925,587, issued Aug. 2, 2005, which is a division of U.S. application Ser. No. 09/375,067, filed Aug. 16, 1999, entitled TURBO CODE iNTERLEAVER WITH NEAR OPTIMAL PERFORMANCE, by Mustafa Eroz, et al., now U.S. Pat. No. 6,334,197, issued Dec. 25, 2001, which claims benefit of U.S. Provisional Application Ser. No. 60/096,807, fried Aug. 17, 1998.

BACKGROUND OF THE INVENTION

The present invention relates to error correction in coding schemes for digital communication systems, and more particularly to design optimization for Interleavers of any size within a specified wide range used in such error correction. Even more particularly, the present invention relates to optimization of Turbo Interleavers such that smaller optimal Interleavers can be built from larger optimal Interleavers.

Interleaving is a process of reordering a sequence of symbols or bits in a predetermined manner. "Interleaver size" is equal to the size of the sequence. The apparatus performing the interleaving is referred to herein as an Interleaver.

Turbo Interleavers are interleavers used in the construction of turbo codes. In a turbo code built as a parallel concatenation of two constituent recursive convolutional codes, a Turbo Interleaver serves to re-order an input data sequence in a pseudo-random fashion prior to an encoding by a second of the constituent codes. As a result, separate encodings produced by the two constituent encoders are largely uncorrelated, which property allows them to be combined by a turbo encoder to produce a composite encoding with excellent error protection capability.

S-random Interleavers are one of the most widespread forms of turbo Interleavers.

The principle behind S-random Interleaves is to avoid mapping neighbor positions of an original input sequence to another neighbor position of the interleaved sequence within a window of size S. The design goal in S-random Interleavers is to maximize S while preserving the above principle. However, S-random Interleavers have to be re-designed every time the Interleaver size is changed and there is typically no requirement of any resemblance between the Interleavers with similar sizes.

Thus, it is desirable to have a general Interleaver design for Interleavers of any size within a set of sizes, wherein the design methodology is concise and efficient such that the same Interleaver design is near-optimal for all Interleavers within the set of sizes. It is also advantageous to have a design for building a near-optimal Interleaver that can easily be reduced to smaller-sized near-optimal Interleavers without performance degradation.

Therefore, the present invention advantageously addresses the above and other needs.

SUMMARY OF THE INVENTION

The present invention advantageously addresses the needs above as well as other needs by providing a method and apparatus for a turbo Interleaver which employs Interleavers of variable length employing one or more permutations.

In one embodiment, the invention is characterized as a method of interleaving blocks of indexed data of varying length. The method includes the steps of: providing a set of basic Interleavers comprising a family of one or more permutations of the indexed data and having a variable length; selecting one of the basic Interleavers based upon a desired Interleaver length L; and adapting the selected basic Interleaver to produce an Interleaver having the desired Interleaver length L.

In another variation, a method of interleaving blocks of indexed data of variable length includes the steps of: providing a family of basic Interleavers comprising "two-dimensional permutations" including computing the "two-dimensional permutations", further comprising: writing the indexed data into an Interleaver matrix having one or more rows in each of two dimensions; permuting the indexed data in one or more rows in at least one of the two dimensions to produce "constituent permutations", possibly being different from one row to another row, wherein the constituent permutations are pseudo-random permutations described by a limited number of parameters, wherein an amount of storage required for storing the limited number of parameters is less than that for storing a vector representation of the constituent permutations; reading out the data from the Interleaver matrix; selecting one of the basic Interleavers for use in encoding based upon a desired Interleaver length L; adapting the selected basic Interleaver to produce an Interleaver having the desired Interleaver length L; wherein the selecting includes: identifying a group of the basic Interleavers having a length greater than or equal to the desired Interleaver length L; and selecting one of the basic Interleavers having a length smallest among the identified group of the basic Interleavers; wherein the adapting includes: deleting indexed data having indices higher than required for a permutation of length L; providing an Interleaver device for interleaving blocks of indexed data, the Interleaver device further comprising a memory device for storing descriptions of the basic Interleavers; and storing the descriptions in the memory device.

In another embodiment, a system for interleaving and turbo encoding blocks of indexed data, of varying length, comprises: a parallel concatenation of two or more constituent encoders for recursive convolutional codes of recursion period p; and an Interleaver device coupled to the parallel concatenation for performing the steps of: accessing stored descriptions of basic Interleavers, the basic Interleavers comprising a family of one or more permutations of the indexed data and having a variable length; identifying a group of the basic Interleavers having a length greater than or equal to a desired Interleaver length L; selecting one of the basic Interleavers having a length which is smallest among the group of the basic interleaves; and adapting the selected one of the basic Interleavers to produce an Interleaver having the desired Interleaver length L.

BRIEF DESCRIPTION OF THE DRAWINGS

The above and other aspects, features and advantages of the present invention will be more apparent from the following more particular description thereof, presented in conjunction with the following drawings wherein:

FIG. 4 is a diagram of performance curves of Turbo Interleavers such as shown in FIG. 2 of Size 1024 bits at Code Rate ½, using four (4) decoder iterations comparing Galois Field Interleavers to S-Random Interleavers and to Random Interleavers for Bit Error rate (BER) and Frame Error Rate (FER) performances;

FIG. 5 is a diagram of performance curves of a Turbo Interleaver such as shown in FIG. 2 of Size 1024 at Code Rate ½, using eight (8) decoder iterations comparing Galois Field Interleavers to S-Random Interleavers and to Random Interleavers for Bit Error Rate (BER) and for Frame Error Rate (FER); and FIG. 6 is a diagram of performance curves of a Turbo Interleaver such as shown in FIG. 2 of size 1152 bits at Code Rate ⅓, using four (4) decoder iterations comparing Galois Field Interleavers to S-Random Interleavers, Random Interleavers for Bit Error Rate (BER) and for Frame Error Rate (FER).

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
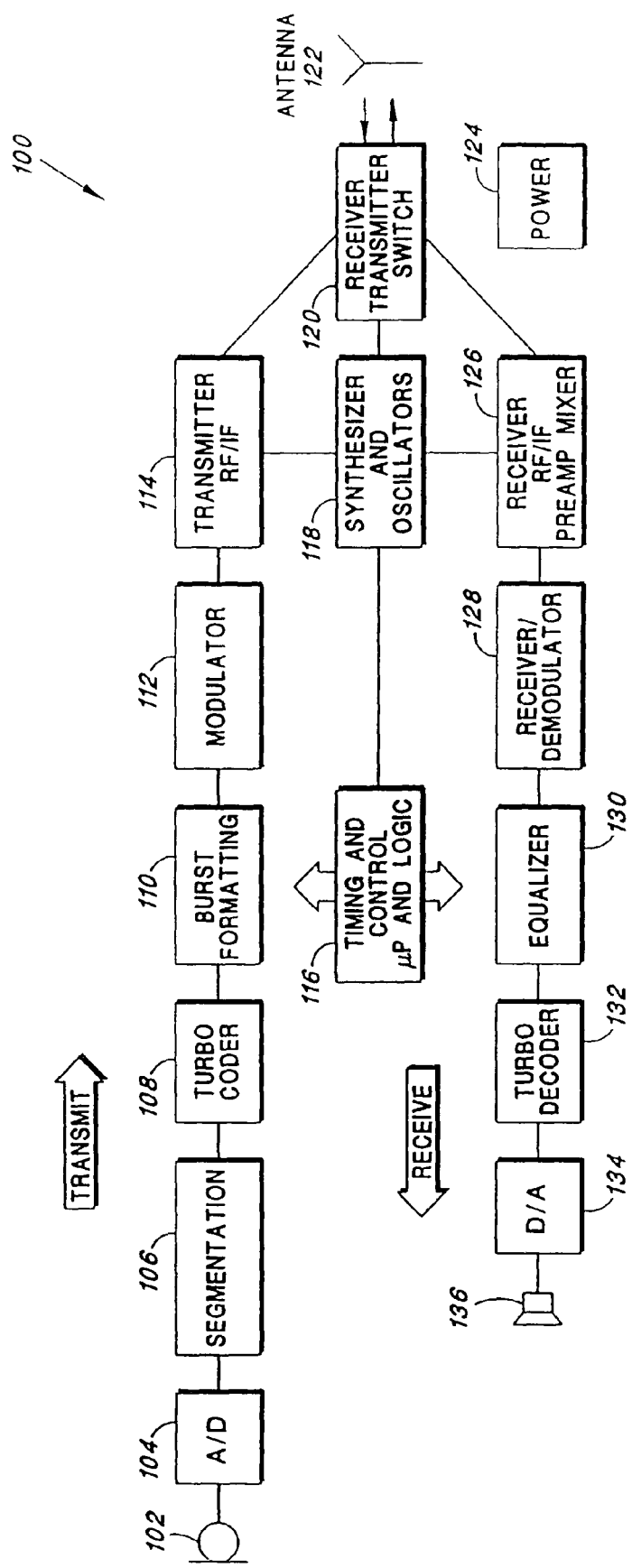
FIG. 1 is a block diagram of hardware of a mobile communication system of a type that could be used to implement the teachings of the present invention.

Referring to FIG. 1, a block diagram is shown of a digital communication system using Turbo Codes of a type that could be used to implement the teachings of the present invention. It comprises transmitter hardware including: a Transmitter Interface 102, an A/D Converter 104; a Segmentation Processor 106; a Turbo Coder 108; a Burst Formatter 110; a Modulator 112; a Transmitter (RF/IF) 114. It also comprises a Power Supply 124; a Timing and Control Processor 116; a Synthesizer and Oscillator 118; and a Switch 120. It comprises receiver hardware including: a Receiver Interface 134; a Turbo Decoder 132; an Equalizer 130; a Receiver/Demodulator 128; and a Receiver (RF/IF) Preamp Mixer 126.

The transmitter receives an analog signal through a Transmitter Interface 102 and performs an A/D conversion at A/D Connector 104. The discrete samples generated from the A/D Converter 104 are fed to Segmentation Processor 106 where fixed-length data units of 44 octets are formed by fragmenting an initial MAC protocol data unit (IMPDU), and then the fixed length data units passed to the Turbo Coder 108 which uses an Interleaver to pseudo-randomize the input between 2 concatenated encoders and encodes the fixed length data units (data streams) and sends encoded data units (data streams) to the Burst Formatter 110.

A burst, a series of repetitive waveforms at a prescribed time and amplitude lasting a short duration, is formed at Burst Formatter 110 and is passed to Modulator 112 where the burst is modulated by mixing with a carrier waveform of known frequency. Transmitter 114 transmits the modulated burst when the switch 120 connects antenna 122 to the Transmitter 114. The Synthesizer and Oscillator 118 keeps track of timing for the transmitter (RF/IF) 114 and for the Timing and Control Processor 116 which controls when bursts are formatted.

When the Antenna 122 receives a burst and the receiver (RF/IF) Preamp Mixer 126 is connected to the antenna through the switch 120, the received burst is amplified by the receiver (RF/IF) Preamp Mixer 126, and then demodulated to remove the carrier waveform frequency. The Equalizer 130 filters the demodulated burst with filters adjusted so as to produce an enhanced digital signal which is next Turbo decoded by Turbo Decoder 132 through a concatenation of decoders and an Interleaver using feedback from each other decoder to decode information from the received burst. Decoded data is converted from digital to analog by D/A Converter 134 and passed through receiver interface 136 to another system for further processing as needed. Since the digital communication system of FIG. 1 would typically communicate using a variety of different information block sizes depending on the service requirements such as for voice or packet data, the embedded turbo code interleaver must be flexible enough to accommodate multiple block sizes without undue sacrifice in turbo code performance.

Figure 2:
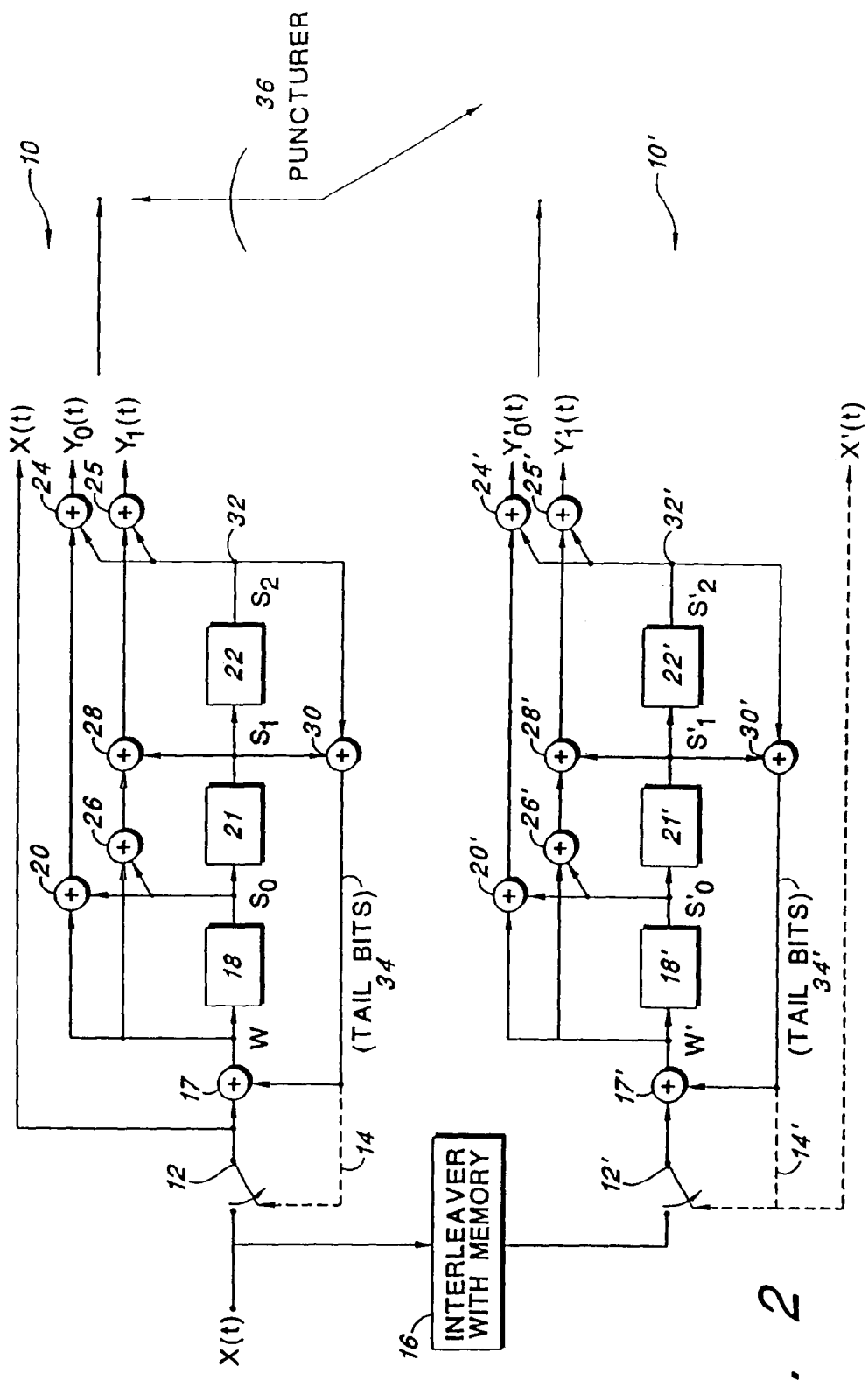
FIG. 2 is a functional block diagram of a Turbo encoder which could be implemented in the system of FIG. 1.

Referring to FIG. 2, a functional block diagram is shown of a representative turbo code encoder consisting of a parallel, concatenation of two simple constituent encoders (encoders) 10, 10', coupled to an Interleaver with memory (Interleaver) 16 and a puncturer 36. The first encoder 10 comprises: modular adders (or binary adders) 17, 20, 26, 28, 24, 25, and 30; shift register delay elements (or "shift registers") 18, 21, 22; a switch 12; output connections for an information bit X(t) and for parity bits $Y_0(t)$, $Y_1(t)$. The second encoder 10' comprises analogous hardware 17', 20', 26', 28', 24', 25', 30', 18', 21', 22', 12'. Output X(t) is coupled to the switch 12 coupled to input X(t). Output $Y_0(t)$ is coupled to modular adder 24 coupled to modular adder 20 at its output, which is coupled to register 18 and modular adder 17 at its input, which is coupled to switch 12. Output $Y_1(t)$ is coupled to modular adder 25 coupled to modular adder 28 at its output and to register 22 at its output. Modular adder 28 is coupled to modular adder 26 at its output and register 21 at its output; modular adder 26 is coupled to modular adder 17 at its output and to register 18 at its output. Modular adder 30 is coupled to modular adder 17 at its input. A detailed description of how the Turbo Coder of FIG. 2 operates in practice follows.

The two constituent encoders 10, 10' produce parity bits $Y_0(t)$, $Y_1(t)$ and $Y_0'(t)$, respectively, selected ones of which are removed from an output stream (output) of the two simple constituent encoders 10, 10' according to a prescribed puncturing pattern by the puncturer 36 in order to achieve a desired overall Turbo code rate. Both the first encoder (encoder #1) 10 and the second encoder (encoder #2) 10' process the same information bit stream and X(t) (or "information bits"), but the encoder #2 10' processes information bits X(t) in a different order than the order in which encoder #1 10 does since the Interleaver 16 processes the information bits X(t) before they reach encoder #2 10'. By rearranging an order of presentation of the information bits X(t), the Interleaver 16 serves to decorrelate the outputs of the two simple constituent encoders 10, 10' so that the information bits X(t) causing encoder #1 10 to produce a low-Hamming weight output are unlikely to cause encoder #2 10' to also produce a low-Hamming weight output.

In FIG. 2, the Interleaver 16 avoids mapping a "neighbor position" to a corresponding "neighbor position" of the interleaved bit sequence. The Interleaver 16 does this in a pseudo-random fashion by re-ordering bit locations in a random-looking predetermined fashion.

Both encoders 10, 10' produce, in addition to the information bits X(t) (or systematic bits), parity bits $Y_0(t)$ and $Y_1(t)$ which are punctured by puncturer 36 to achieve a desired overall Turbo Code rate.

Information bit stream X(t) is received at switch 12, and is processed in accordance with several modular adders of above and shift registers above which are hard-wired to represent two (2) numerator polynomials and one denominator polynomial.

Referring still to FIG. 2, a denominator polynomial d(D), representing Turbo Code "1010", is hardwired by the return feedback connection to modular adder 17 and its respective connections to modular adder 30. Before computing, three shift registers 18, 21, and 22 are first zeroed.

A first numerator polynomial over a denominator polynomial, representing Turbo Code "1101" is hardwired to return output $Y_0(t)$ by combining: X(t) with a result of modulator adder 17 to create a first bit W(t); the modular sum (second bit) of shift register 18 and W(t) from the modular adder 20; another zero bit (third bit) indicated by the lack of connection to the register 21; and the modular sum (fourth bit) of another register 22 and a result of modular adder 20 from modular adder 24. The result is $Y_0(t)=W(t)+S_0(t)+S_2(t)$.

Information bit stream X(t) is presented in its original, uninterleaved order at a switch 12 and processed by the first encoder 10. In FIG. 2, the first encoder 10 is implemented as a linear feedback shift register whose transfer function is:

$$G(D) = \left[ 1 \frac{1+D+D^3}{1+D^2+D^3} \frac{1+D+D^2+D^3}{1+D^2+D^3} \right].$$

Thus, during an encoding step at time $t \geq 0$, a shift register contents of the shift register 18, 21, 22, are $S_0(t), S_1(t), S_2(t)$ and the information bit X(t) is present at the input to binary adder 17. The encoder 10 then produces its two coded output bits (coded bits) $Y_0(t), Y_1(t)$ according to the following two summations:

$Y_0(t)=W(t)+S_0(t)+S_2(t)$ $Y_1(t)=W(t)+S_0(t)+S_1(t)+S_2(t),$ wherein $W(t)=X(t)+S_1(t)+S_2(t).$ After the coded bits are output, the current encoding step at time t is completed by shifting the contents of the shift register 18, 21, 22 once to prepare for a next encoding step at time t+1. At time t+1:

$S_0(t+1)=W(t), S_1(t+1)=S_0(t)$ and $S_2(t+1)=S_1(t)$. At the start of an encoding process at t=0, the shift register contents are initialized to zero, wherein $S_0(0)=S_1(0)=S_2(0)=0$. The second encoder 10' operates in the same fashion on an output of Interleaver 16 to produce another two (2) coded output bits.

Since the digital communication system of FIG. 1 would typically communicate using a variety of different information block sizes depending on the service requirements such as for voice or packet data, an embedded turbo code interleaver within turbo coder 108 must be flexible enough to accommodate multiple block sizes without undue sacrifice in turbo code performance. In its most general form, an interleaver design proposed herein consists of a collection of basic interleavers of various block lengths, an algorithm for selecting one of the basic interleavers to use as a "mother" interleaver, and a method of adapting the mother interleaver to produce a turbo interleaver of a particular desired length.

The basic interleavers are stored in a memory, which may be located within the Interleaver 16 as in FIG. 2, either as an explicit table of read or write indices or as a smaller set of parameters from which the table of read or write indices can be regenerated according to a predetermined algorithm.

A couple of simple examples will clarify these concepts. First, consider an interleaver of length 8 using a permutation $\pi=(04261537)$. This permutation could be used as either a list of write (input sequence) addresses or read addresses. Let $d_I(0), d_I(1), \ldots, d_I(7)$ denote input data (input sequence) in their original sequence; and let $d_o(0), do(1), \ldots, d_o(7)$ denote values of the same input data but in a permuted order. The interleaver could be implemented to write $d_1(o)$ to output position 0, $d_I(1)$ to output position 4, $d_I(2)$ to output position 2, $d_I(3)$ to output position 6, etc. In this case, the interleaver action can be expressed mathematically as $d_o(\pi(k))=d_I(k).$ Alternately, the interleaver could be implemented to read data values from the input data according to the permutation n. That is, a first interleaved value $d_o(0)$ is read from input position 0, a second interleaved value $d_o(1)$ is read from input position 4, and so on. Mathematically, $d_o(k)=d_I(\pi(k)).$ Neither interpretation is to be preferred; it is merely a matter of convention. For purposes of describing interleaver operations herein, the first interpretation (in which permutations specify write addresses for the interleaver) is used.

It should be noted, however, that in a turbo decoder, such as the turbo decoder 132 in FIG. 1, both interleaving and its inverse (de-interleaving) are used. If the interleaver is implemented to use the permutation $\pi$ as write addresses, the de-interleaver can be implemented to use the permutation $\pi$ as read addresses. This means that the interleaving and de-interleaving operations can share the same permutation generation hardware of software. It is not necessary to store descriptions of both the interleaver and its de-interleaver separately.

The permutation $\pi=(04261537)$ arises from bit-reversal indexing. For example, input position 1 has a 3-bit binary representation 001 and is mapped to output position 4, which has 100 as its 3-bit binary representation. Likewise, input position 3 (binary 011) is mapped to output position 6 (binary 110). In VLSI hardware or on some digital signal processing, which, optionally may be employed within the Interleaver 16 bit-reversed indexing is easily accomplished without special memory storage.

The permutation $\pi=(03614725)$ can be generated by the simple mathematical recursion:

$\alpha=3; \pi(0)=); \pi(k)=\pi(k-1)+\alpha(\mod 8).$

Different recursions of this type can be described by the two parameters $\alpha$ and $\pi(0)$. Thus, a family of basic interleavers based on simple recursive formulas could be represented by a small table of parameters stored in the memory. Advantageously, for an interleaver of large block length or a large set of interleavers of various block lengths, the ability to store a small table of parameters rather than the explicit permutations results in a large reduction in memory requirements. Thus, it is advantageous to design turbo interleavers in this way provided a parameterized family of interleavers results in good turbo code performance. These design issues are favorably addressed by the proposed invention.

Given a family of basic interleavers of various block sizes represented and stored in memory in some fashion, a turbo device (either the turbo encoder 108 or the turbo decoder selects one of them for use in implementing an interleaver of specific length L. In one preferred embodiment of the invention, the lengths of the basic interleavers are all different, and the turbo device selects the basic interleaver having a smallest length N among all basic interleavers whose lengths are at least as big as the desired length L.

In other embodiments, it may be desirable to have multiple basic interleavers all of the same length. For example, there may be an implementation advantage in having all basic interleavers have lengths that are integral powers of two. In such a design, there may be multiple basic interleavers of length $N=2^c$, each optimized for a different interval of block sizes between $2^{c-1}$ and $2^c$. In such embodiments, the turbo device (turbo encoder 108, turbo decoder 132) first identifies a set of basic interleavers having a smallest length N among all the basic interleavers whose lengths are at least as big as the desired length L and then selects one of the basic interleavers in the set according to other selection criteria depending on L.

Once a basic interleaver has been selected, it is then adapted to length L by the process referred to herein as pruning. Pruning refers to a discarding of permutation indices that are invalid for a pruned matrix. For example, one prunes the permutation $\pi=(03614725)$ f length 8 on the integers modulo 8 to a new permutation of length 5 on the integers modulo 5 by ignoring the invalid indices 5, 6 and 7. Thus, a pruned permutation is $\pi^*=(03142)$.

Figure 3:
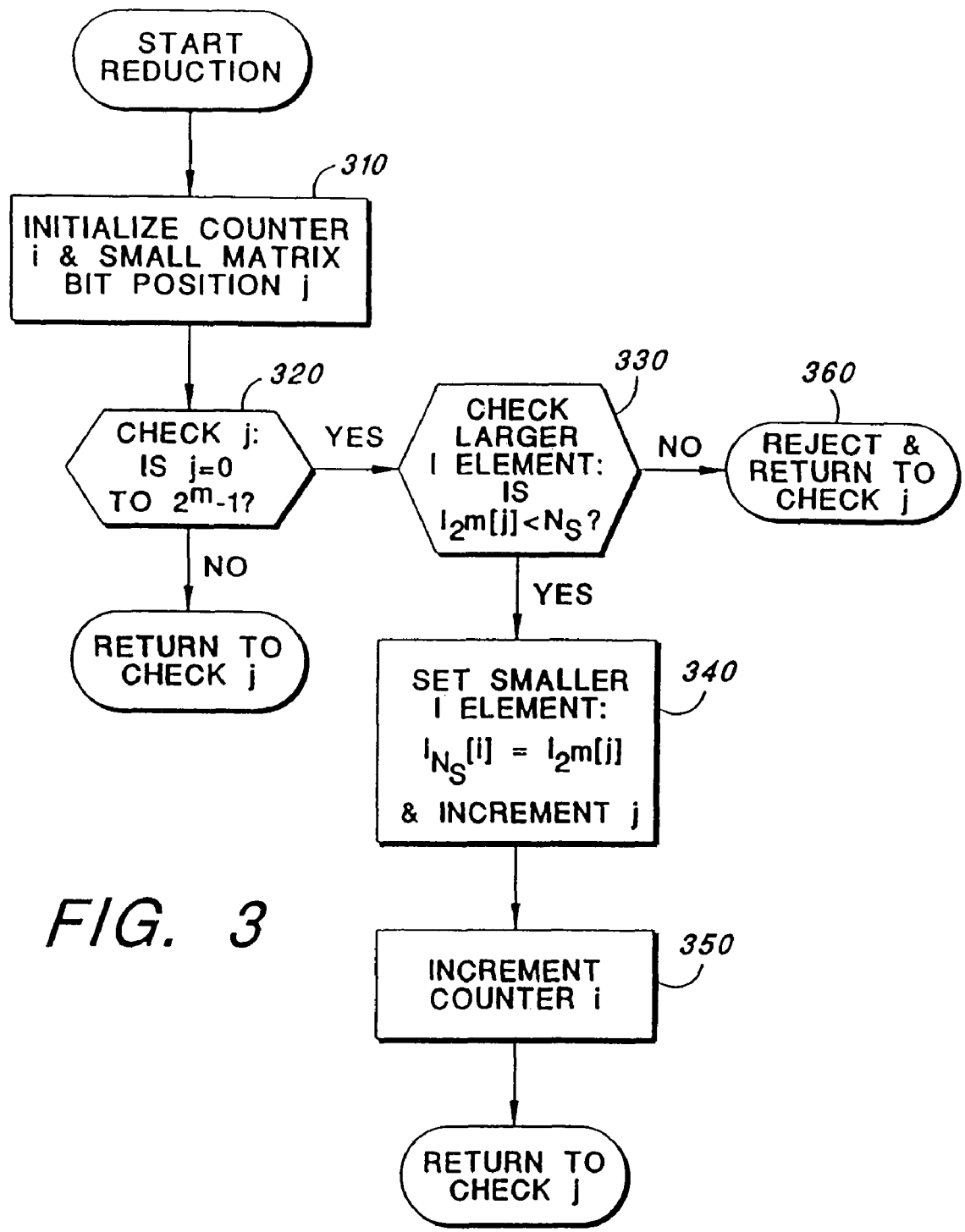
FIG. 3 is a flow chart of steps traversed by the mobile communication system of FIG. 1 and encoding system of FIG. 2 in accordance with an embodiment of the present invention.

The process of pruning, in accordance herewith, is further explained by an algorithm shown in FIG. 3. For simplicity, the algorithm assumes that the basic interleavers all have lengths that are integral multiples of two. The processing steps are as follows:

The above rules are refined later herein so that Rule 1 and Rule 2 continues to be satisfied for Turbo Interleavers of any size N obtained from a single Interleaver of size $2^m$ by means of puncturing ($2^{m-1}<N\leq 2^m$). Obtaining an Interleaver of any size N from a mother Interleaver of a larger size via puncturing is one aspect of this invention.

A smaller Interleaver $I_{N_s}$ of size $N_s$ is formed by using a pre-designed Interleaver matrix, $I_{2^m}$, of size $2^m$, where m is chosen such that it is the smallest integer for which $2^m \geq N_s$, i.e., the smallest power of two that is larger than or equal to the size N number of elements, N an integer, in the Interleaver $I_N$.

A Smaller Interleaver, $I_{N_s}$, is then generated from the pre-designed Interleaver, $I_{2^m}$ by puncturing the predesigned Interleaver, $I_{2^m}$.

Thus, a Smaller Interleaver, $I_{N_s}$, is created by only accepting bit positions into the smaller Interleaver, $I_{N_s}$, from the original pre-designed Interleaver, $I_{2^m}$, if the bit position value is smaller than the size of the smaller Interleaver, $I_{N_s}$, measured by the number of elements in the smaller Interleaver, $N_s$.

This can be accomplished, for example, by a processor modified with a computer program, the steps of which are shown in FIG. 3, that initiates the following steps:

1) Initialize a counter i to zero, where i represents a new smaller Interleaver bit position, and j represents an original larger Interleaver bit position. This corresponds to Initialize Counter 310 in FIG. 3;

2) For every original bit position $I_{2^m}[j]$; where j is from 0 to $2^m-1$ (Check j 320 of FIG. 3), initiate the further steps:

If $I_{2^m}[j]<N_s$, set $I_{N_s}[i]=I_{2^m}[j]$ and increment the counter i. These steps correspond to Check Larger I Element 330, Set Smaller I Element 340, and Increment Counter 350 respectively, of FIG. 3.

Otherwise reject $I_{2^m}[j]$ per Reject and Return 360 of FIG. 3. This program accepts, consecutively, from a first to a last bit position, any original bit position of an original Interleaver which has a value less than the smaller Interleaver size.

Pruning is a key aspect of the invention described herein. It is the advantage that the method is easily implemented in either a VLSI or a DSP and so provides an efficient mechanism for providing interleavers of arbitrary lengths without storing separate descriptions for every possible length. The set of basic interleavers are designed to be robust with respect to pruning in accordance with principles to be described in conjunction with a detailed, explicit design illustrative of the invention.

The design of a turbo interleaver should take into account the structure of the constituent recursive convolutional codes in order to ensure that an overall Turbo code has a favorable Hamming weight spectrum ("weight spectrum") leading to good error correction performance. The weight spectrum of a linear binary code of length N is a tabulation giving a number of code words of each Hamming weight from 0 to N. A Hamming weight is a number of non-zero entries in the code word. Since the constituent code of a Turbo Code is recursive, it takes an input sequence of a Hamming weight of at least two (2) to cause a systematic encoder to leave an all zero state and later to return to the all zero state and therefore to generate a less desirable, low parity Hamming weight sequence. In general, a systematic, recursive encoder would generate a parity sequence of high Hamming weight for input sequences having a Hamming weight of one (1), since the encoded sequence upon leaving the all zero-state can never return to it. For recursive convolutional codes as constituent codes, the probability that both encoders generate encoded sequences that leave the all zero-state and later return to the all zero-state is the highest when the input sequence is of Hamming weight two (2).

It is also observed that when the recursive eight-state constituent encoders have a primitive feedback polynomial of degree 3, an input sequence of Hamming weight two (2) can cause the first constituent encoder to generate a finite error event only if the two "1's" in the input sequence are separated by 6+7n (n is an integer) zeros. It is therefore important that any input sequence consisting of exactly two 1's separated by 6+7n (n∈N) zeros should not be mapped by the interleaver to a new sequence with two 1's now separated by 6+7m (m∈N) zeros. In that way the second encoder 10' will generate high parity Hamming weight when the first encoder generates low parity Hamming weight, and vice versa, corresponding to an input sequence of Hamming weight two (2).

Even if the two 1's are separated by the undesirable 6+7n zeros in an input sequence of Hamming weight two, the corresponding parity Hamming weight will grow larger as n grows larger. Thus, it is less crucial to address the cases for n>1, as the most critical values for n are 0 followed by 1, respectively. This is because as n grows, parity Hamming weight grows sufficiently larger.

The rules that are introduced in one embodiment of the invention to design Turbo Interleavers for eight-state Turbo codes are thus:

Rule 1: Minimize the occurrence of events:

$$|I[x]-I[x-7]|=7 \tag{1}$$

wherein I[x] denotes the position that x is mapped to by the Interleaver matrix I.

Rule 2: If the first rule is satisfied with zero occurrences of equation (1), minimize the occurrence of event:

$|I[x]-I[x-7]|=14$, or $|I[x]-I[x-14]|=7$, or $|I[x]-I[x-14]|=14$ (2)

By following the above created rules, the probability of both of the encoders 10, 10' generating low-Hamming weight parity sequences is minimized.

An explicit exemplary turbo interleaver design (exemplary design) will not be described in order to more fully illustrate and develop the concepts of the invention. In the exemplary design, each of the basic interleavers implemented by the Interleaver 16 is a two-dimensional block interleaver (or interleaver matrix) of dimension R×C, where R-$2^r$ is a number rows and C-$2^c$ is a number of columns. Conceptually, the input data (data) are written into the interleaver matrix row by row. Then row and column permutations are performed to randomize data positions. The data are then read out column by column. Specifically, given an input position l=C·i+j, a corresponding output interleaved position will be given by mathematical formula I (l)=R·$\pi_i$(j)+ρ(i), wherein $\pi_i$ is a column permutation applied to data in row i and wherein ρ is bit-reversed indexing, which is especially simple to implement and requires no additional parameter storage in the memory of the interleaver 16.

One could, of course, make the ρ permutation different for different columns ad the expense of additional implementation complexity and increased storage requirements to specify each of the individual column permutations. In either case, the ρ premutation(s) should perform pseudo-random interlacing of top and bottom halves of the interleaver matrix in order to facilitate on-the-fly implementation of pruning. Such interlacing ensures that, if I(l) is an invalid index for a pruned interleaver, then I(l+1) will be a valid index, assuming that no basic interleaver is pruned to half its length or beyond.

The proposed two-dimensional structure is advantageous for use in turbo interleaving for several reasons. Since the turbo interleaver is built in a structured way from simple constituent permutations that can be described by a small set of parameters, implementation complexity is small. When different constituent permutations are used from row to row, a composite interleaver permutation exhibits sufficient randomness to achieve good turbo code performance despite its low complexity. Furthermore, by choosing R and C appropriately, one can balance the "spreading capability" of the interleaver (how well is separates neighboring positions) and its "randomness" properties. The spreading capability of the interleaver is also important for the turbo interleaver in that it helps to enhance the overall "weight spectrum" of the turbo code. In general, spreading capability increases with increasing R, and randomness increases with increasing C.

Preferably, as a rule of thumb, for building interleaver matrixes in accordance with the invention, one would make R as large as possible without making C so small that the randomness produced by the permutations applied to each row is degraded.

Thus, in the illustrative designs presented below, the set of basic interleavers have the property that, in general, those of larger length use a larger number of rows R. This is an important aspect of the two-dimensional design.

In the illustrative designs, in accordance with one aspect of the invention presented below, the constituent permutations applied to rows of the interleaver matrix are based on a novel class of permutations derived from Galois field arithmetic.

A Galois Field (GF) with $p^m$ elements is denoted as GF($p^m$), wherein p is a prime number and m is any integer greater than one (1). It can be formed from GF(p) using a primitive polynomial p(x) of degree m over GF(p)[x]. In the case of GF($2^m$), the roots of primitive polynomial p(x) of degree m over GF(2)[x], form a subset of the primitive elements in GF($2^m$). A primitive element in a Galois field with q elements has order q-1, i.e., the smallest positive integer n such that $\alpha^n=1$ is n=q-1.

If $\alpha$ is a primitive element in GF($2^m$), all of the other nonzero elements of GF($2^m$) can be obtained as consecutive powers of α.

$$GF(2^m)=\{0,\alpha^0=1,\alpha,\alpha^2,\alpha^3,\ldots,\alpha^{2m-2}\}$$ (5)

Furthermore, every element of the field GF($2^m$) can be expressed in terms of $1,\alpha,\alpha^2,\ldots,\alpha^{m-1}$;

For example, GF(8) can be constructed from GF(2) using the primitive polynomial p(x)=$x^3$+x+1 over GF(2)(x). Let α be a root of p(n). Multiplication of elements can be performed using the fact that $\alpha^7=1$ (by definition since α is primitive in GF(8)). Addition of elements in GF(8) can be performed using equalities in terms of 1, α, and $\alpha^2$ since $\alpha^3=\alpha+1$, in Galois Field arithmetic (where 1≡-1).

An exemplary multiplication of elements in GF(8) is Equation (4).

$$\alpha^3\cdot\alpha^6=\alpha^9=\alpha^2$$ (6)

An exemplary addition is Equation (5).

$$\alpha^3+\alpha^4=(\alpha+1)+(\alpha^2+\alpha)=\alpha^2+1=\alpha^6$$ (7)

An Interleaver of size $2^m$, $I_2^m$, is formed by the following four (4) steps:

(1) First, a matrix is filled row by row with bit positions starting with 0 in the upper leftmost position, and ending with (r×c–1, where $2^m$=r×c as defined above) in the lower rightmost position. This is the conventional manner of filling Interleaver matrices.

Thus, an Interleaver matrix of size 32=4×8 would result in matrix (8):

$$\begin{bmatrix} 0 & 1 & 2 & 3 & 4 & 5 & 6 & 7 \\ 8 & 9 & 10 & 11 & 12 & 13 & 14 & 15 \\ 16 & 17 & 18 & 19 & 20 & 21 & 22 & 23 \\ 24 & 25 & 26 & 27 & 28 & 29 & 30 & 31 \end{bmatrix}$$ (8)

(2) Secondly, permute each row i (i=0, 1, 2, . . . , r–1) (within itself according to a predetermined rule. One method is to permute) according to the following permutation rules employing Galois Field arithmetic (9):

$j \leftarrow \log_\alpha^{i_b}(\alpha^{i_o+\alpha^j})$ for $j=0,1,2,3,\ldots,c-2$ $j \leftarrow \log_\alpha^{i_b}(\alpha^{i_o})$ for $j=c-1$ (9)

In Equation (9), ∝ is a root of the primitive polynomial p(n) used to construct GF(c), $\alpha^{i_b}$ is primitive in GF(c) and $i_o$ is a designed integer between 0 and c–2 inclusive, and $i_b$ is a predetermined integer, $i_o$ and $i_b$ selected based upon certain design rules to be described.

Furthermore, by definition $\log_\alpha^{i_b}$ (o) is set to (c–1) as a result of the second part of Equation (9).

An exemplary permutation would be such as is shown in Equation (10) for each row i (i=0, 1, 2, 3), for an Interleaver of size 32 having 8 columns and 4 rows.

$j \leftarrow \log_\alpha^{i_b}(\alpha^{i_o}+\alpha^j)$ for $j=0,1,2,3,4,5,6$ $j \leftarrow \log_\alpha^{i_b}(\alpha^{i_o})$ for $j=7$ (10)

For the sake of demonstration, Table 1 is constructed with constants $i_b$ and $i_o$ to permute a Turbo Interleaver matrix of size $N_s$, within the set N, where 16<N≦32. The values of Table 1 are fabricated herein for the sake of the following example for the construction of $I_{32}$.

TABLE 1

| i | $i_b$ | $i_0$ |
|---|---|---|
| 0 | 1 | 0 |
| 1 | 1 | 2 |
| 2 | 3 | 5 |
| 3 | 6 | 4 |

Thus, in accordance with Table 1, each row is shuffled such that:

row $i+0$:$j \leftarrow \log_\alpha(\alpha^j+1)$ for j=0,1,2,3,4,5,6)

$j \leftarrow \log_\alpha(1)$ for j=7 (11)

row $i=1$:$j \leftarrow \log_\alpha(\alpha^j+\alpha^2)$ for j=0,1,2,3,4,5,6

$j \leftarrow \log_\alpha(\alpha^2)$ for j=7 (12)

row $i=2$:$j \leftarrow \log_\alpha 3(\alpha^j+\alpha^5)$ for j=0,1,2,3,4,5,6

$j \leftarrow \log_\alpha 3(\alpha^5)$ for j=7 (13)

row $i=3$:$j \leftarrow \log_\alpha 6(\alpha^j+\alpha^4)$ for j=0,1,2,3,4,5,6

$j \leftarrow \log_\alpha 6(\alpha^4)$ for j=7 (14)

The shuffling of each row results in a pseudo-random order of positions represented by sequences to the right of each of the arrows in equations (15), which represent the original bit positions which map to newly ordered sequences to the left of each arrow:

row 0:(0,1,2,3,4,5,6,7)←(7,3,6,1,5,4,2,0)

row 1:(0,1,2,3,4,5,6,7)←(6,4,7,5,1,3,0,2)

row 2:(0,1,2,3,4,5,6,7)←(6,2,1,3,0,7,5,4)

row 3:(0,1,2,3,4,5,6,7)←(2,5,6,1,7,0,4,3) (15)

The above shuffling results in an Interleaver matrix:

$$\begin{bmatrix} 7 & 3 & 6 & 1 & 5 & 4 & 2 & 0 \\ 14 & 12 & 15 & 13 & 9 & 11 & 8 & 10 \\ 22 & 18 & 17 & 19 & 16 & 23 & 21 & 20 \\ 26 & 29 & 30 & 25 & 31 & 24 & 28 & 27 \end{bmatrix} \quad (16)$$

(3) Thirdly, each of the rows of Interleaver matrix $I_{32}$ are shuffled or re-ordered according to any method that interlaces an upper half of the matrix resulting from the above permutations, with a lower half of the matrix.

One method of doing this is to re-order the rows according to a bit reversal on row index (e.g. as represented by the pattern (00,01,10,11) for a four-row matrix). From the above example matrix, this results in matrix:

$$\begin{bmatrix} 7 & 3 & 6 & 1 & 5 & 4 & 2 & 0 \\ 22 & 18 & 17 & 19 & 16 & 23 & 21 & 20 \\ 14 & 12 & 15 & 13 & 9 & 11 & 8 & 10 \\ 26 & 29 & 30 & 25 & 31 & 24 & 28 & 27 \end{bmatrix} \quad (17)$$

(4) Fourthly, the contents of the resulting permuted and re-ordered matrix, or Interleaver matrix, are read out column by column to an encoder as in the case of a Block Interleaver.

In the above example, this results in the bit position sequence:

7 22 14 26 3 18 12 29 6 17 15 30 1 19 13 25 5 16 9 31 4 23 11 24 2 21 8 28 0 20 10 27 (18)

Permutations of the rows within themselves should be done in such a way that Rule 1 and Rule 2 are satisfied for any Interleaver size N obtained from an original Interleaver of size $2^m$ where $2^{m-1} < N \leq 2^m$.

The preferred basic interleaver structure, described previously herein allows the formulation of simple design criteria that help ensure robustness to pruning. The key observation is that, because of the way Interleavers of size $2^m$ are constructed, for any window of size 2W, W an integer, there is at most W indices that must be pruned in order to obtain an Interleaver of size N wherein $2^{m-1} < N \leq 2^m$. An Interleaver of 17 elements is obtained by pruning the interleaver of equation (18).

7 14 3 12 6 15 1 13 5 16 9 4 11 2 8 0 10, (19)

resulting in an Interleaver matrix having elements of 7 14 3 12 6 15 1 13 5 16 9 4 11 2 8 0 10.

Thus, the previously discussed rules for good turbo interleaver design—Rules 1 and 2 given in equations (1) and (2)—can be generalized to provide rules for the design of good turbo interleavers that are robust to pruning. The modified rules are as follows:

Modified Rule 1: Minimize the occurrence of events.

$|I[x]-I[x-j]|=7$ where $7 \leq j \leq 14$, j∈N (20)

Modified Rule 2: If the first modified rule is satisfied with zero occurrence, minimize the occurrence of events.

$|I[x]-I[x-j]|=7$, or (21)

$|I[x]-I[x-j]|=14$ where $7 \leq j \leq 28$, j∈N (22)

A third Rule is also introduced: Rule 3: If the Modified Rule 1 and Modified Rule 2 are satisfied with zero occurrence, maximize the variable S such that, neighbor positions within a window size S are not mapped to neighbor positions within a window of size S.

Because of the key observation stated before the modified rules, it can be seen that if an Interleaver of size $2^M$ satisfies Modified Rule 1 and Modified Rule 2, then all of the Interleavers of size N ($2^{m-1} < N \leq 2^m$) obtained by pruning satisfy Rule 1 and Rule 2 stated at the beginning of this invention.

In designing preferred integer constants $i_o$ and $i_b$ for the Galois Field permutations to achieve pseudo-randomness in a Galois Field Interleaver, performance of constructed Interleaver matrices are measured according to how well they meet the modified rules above.

Interleaver matrices of size 128, 256, 512, 1024, 2048 and 4096 are constructed in accordance with the modified rules to yield near optimal Interleaver matrices of any size N where $64 < N \leq 4096$.

The primitive polynomials used to construct GF(c), where c is the number of columns of the Interleaver matrix are as follows:

$p(x)=x^4+x+1$ to construct GF(16)

$p(x)=x^5+x^2+1$ to construct GF(32)

$p(x)=x^6+x+1$ to construct GF(64)

$p(x)=x^7+x^3+1$ to construct GF(128)

$p(X)=x^8+x^4+x^3+x^2+x$ to construct GF(256)

$p(x)=x^9+x^4+1$ to construct GF(512) (23)

Table 2 shows best values of $i_b$ and $i_o$, as defined and determined above, for each row index i for each Interleaver matrix size specified.

TABLE 2

Galois Field (GF) Turbo Interleavers of Size $2^m = r \times c$

| Row Index i | Int. Size: 128 = 8 × 16 | | Int. Size: 256 = 8 × 32 | | Int. Size: 512 = 16 × 32 | | Int. Size: 1024 = 16 × 64 | | Int. Size: 2048 = 32 × 64 | | Int. Size: 4096 = 32 × 128 | |
|---|---|---|---|---|---|---|---|---|---|---|---|---|
| | $i_b$ | $i_o$ | $i_b$ | $i_o$ | $i_b$ | $i_o$ | $i_b$ | $i_o$ | $i_b$ | $i_o$ | $i_b$ | $i_o$ |
| 0 | 13 | 1 | 18 | 22 | 11 | 3 | 26 | 19 | 29 | 50 | 11 | 11 |
| 1 | 2 | 8 | 5 | 8 | 8 | 28 | 17 | 28 | 55 | 20 | 89 | 20 |
| 2 | 14 | 6 | 1 | 4 | 18 | 22 | 26 | 60 | 32 | 13 | 13 | 82 |
| 3 | 8 | 14 | 12 | 15 | 2 | 27 | 34 | 6 | 38 | 15 | 33 | 120 |
| 4 | 13 | 12 | 24 | 13 | 5 | 11 | 25 | 60 | 17 | 51 | 2 | 105 |
| 5 | 4 | 5 | 23 | 25 | 8 | 12 | 58 | 38 | 20 | 37 | 71 | 69 |
| 6 | 13 | 6 | 16 | 27 | 9 | 14 | 41 | 5 | 34 | 50 | 73 | 23 |
| 7 | 14 | 9 | 16 | 30 | 8 | 7 | 25 | 40 | 4 | 24 | 70 | 87 |
| 8 | | | | | 24 | 9 | 32 | 55 | 32 | 36 | 64 | 72 |
| 9 | | | | | 14 | 16 | 26 | 31 | 8 | 0 | 95 | 73 |
| 10 | | | | | 28 | 6 | 38 | 16 | 31 | 25 | 14 | 36 |
| 11 | | | | | 11 | 17 | 50 | 28 | 61 | 37 | 108 | 102 |
| 12 | | | | | 9 | 2 | 23 | 46 | 62 | 38 | 21 | 64 |
| 13 | | | | | 3 | 24 | 22 | 40 | 25 | 27 | 67 | 109 |
| 14 | | | | | 2 | 3 | 55 | 32 | 10 | 41 | 14 | 42 |
| 15 | | | | | 11 | 14 | 19 | 21 | 43 | 51 | 106 | 27 |
| 16 | | | | | | | | | 37 | 5 | 63 | 64 |
| 17 | | | | | | | | | 10 | 43 | 17 | 13 |
| 18 | | | | | | | | | 41 | 54 | 65 | 5 |
| 19 | | | | | | | | | 26 | 4 | 62 | 46 |
| 20 | | | | | | | | | 10 | 44 | 116 | 111 |
| 21 | | | | | | | | | 40 | 19 | 12 | 68 |
| 22 | | | | | | | | | 17 | 26 | 65 | 48 |
| 23 | | | | | | | | | 44 | 60 | 53 | 3 |
| 24 | | | | | | | | | 16 | 23 | 66 | 60 |
| 25 | | | | | | | | | 19 | 39 | 47 | 90 |
| 26 | | | | | | | | | 38 | 58 | 126 | 59 |
| 27 | | | | | | | | | 47 | 54 | 115 | 1 |
| 28 | | | | | | | | | 13 | 38 | 113 | 38 |
| 29 | | | | | | | | | 46 | 7 | 12 | 9 |
| 30 | | | | | | | | | 46 | 22 | 57 | 75 |
| 31 | | | | | | | | | 17 | 13 | 55 | 6 |

In all cases of Interleavers and associated matrices designed from the above constants in accordance with the invention, Modified Rule 1 and Modified Rule 2 is completely satisfied except for a small number of In one embodiment, a computer search determines the constants such that the Modified Rules are satisfied.

Referring to FIG. 4, simulation results are shown for a random, S-random and the new Galois Field Interleaver in accordance with the present invention of size 1024 over AWGN channel with overall Turbo code rate ½, wherein the encoder consists of eight-state constituent encoders with the transfer function:

$$G(D) = \left[1, \frac{1 + D + D^3}{1 + D^2 + D^3}\right] \quad (24)$$

Curve 410 of FIG. 4 shows that with four (4) decoder iterations, the Galois Field (GF) Interleaver has about a 0.1 dB gain with respect to a comparable S-Random Interleaver (S=12) at a bit error rate of $10^{-5}$. A comparable random Interleaver has the worst performance. For Frame Error Rate performance, curve 420 shows that a (GF) Interleaver is also the best performing Interleaver.

FIG. 5 illustrates the corresponding performance for eight (8) decoder iterations. Curve 510 illustrates the Bit Error Rate performance compared to the others. Curve 520 illustrates the Frame Error Rate performance compared to the others. Results are consistent with FIG. 4.

FIG. 6 illustrates the performance of Turbo Interleavers of size 1152 over AWGN channel with overall Turbo code rate ⅓, and with four (4) decoder iterations. The GF Interleaver of size 1152 is formed from a (GF) Interleaver of size 2048 in accordance with this present invention. In this case, performance curves 310 for Bit Error Rate and 320 for Frame Error Rate illustrate that (GF) Interleavers have comparable performance with S-random Interleaver (S=13).

The illustrative design of Table 2 can be simplified by further restricting the choice of parameters. For example, the hardware implementation as well as storage requirements are reduced if the parameter $i_b$ is made constant and equal to 1. In this case, the parameters describing the constituent permutations to be applied within each row R should be re-optimized with respect to Modified Rules 1 and 2.

Table 4 shows the near optimal values of integer constant $i_o$ for each row index i and each Interleaver matrix size, if $i_b$ is 1.

TABLE 4

Simplified Galios Field (GF) Turbo Interleavers of Size $2^m = r \times c$

| Row Index i | Int. Size: 256 = 8 × 32 $i_o$ | Int. Size: 512 = 16 × 32 $i_o$ | Int. Size: 10 × 24 = 16 × 64 $i_o$ | Int. Size: 2048 32 × 64 $i_o$ | Int. Size: 4096 = 32 × 128 $i_o$ | Int. Size: 8192 = 64 × 256 $i_o$ | Int. Size: 16384 = 64 × 256 $i_o$ | Int. Size: 32768 = 64 × 512 $i_o$ |
|---|---|---|---|---|---|---|---|---|
| 0 | 1 | 20 | 44 | 54 | 33 | 42 | 209 | 282 |
| 1 | 4 | 1 | 40 | 52 | 84 | 89 | 35 | 107 |
| 2 | 22 | 14 | 3 | 38 | 56 | 3 | 91 | 226 |
| 3 | 3 | 17 | 10 | 42 | 110 | 17 | 68 | 132 |
| 4 | 5 | 5 | 8 | 5 | 92 | 32 | 242 | 391 |
| 5 | 29 | 21 | 45 | 13 | 19 | 24 | 252 | 362 |
| 6 | 28 | 24 | 7 | 45 | 62 | 23 | 131 | 119 |
| 7 | 9 | 28 | 28 | 60 | 50 | 11 | 208 | 139 |
| 8 | | 19 | 37 | 25 | 45 | 109 | 29 | 129 |
| 9 | | 12 | 2 | 2 | 73 | 104 | 175 | 446 |
| 10 | | 30 | 17 | 27 | 14 | 86 | 37 | 65 |
| 11 | | 16 | 14 | 59 | 104 | 54 | 233 | 207 |
| 12 | | 29 | 55 | 53 | 78 | 60 | 12 | 95 |

TABLE 4-continued

Simplified Galios Field (GF) Turbo Interleavers of Size $2^m$ = rxc

| Row Index i | Int. Size: 256 = 8 × 32 $i_o$ | Int. Size: 512 = 16 × 32 $i_o$ | Int. Size: 10 × 24 = 16 × 64 $i_o$ | Int. Size: 2048 32 × 64 $i_o$ | Int. Size: 4096 = 32 × 128 $i_o$ | Int. Size: 8192 = 64 × 256 $i_o$ | Int. Size: 16384 = 64 × 256 $i_o$ | Int. Size: 32768 = 64 × 512 $i_o$ |
|---|---|---|---|---|---|---|---|---|
| 13 |  | 2 | 48 | 29 | 103 | 52 | 141 | 153 |
| 14 |  | 25 | 19 | 33 | 98 | 55 | 196 | 208 |
| 15 |  | 23 | 12 | 20 | 59 | 95 | 239 | 399 |
| 16 |  |  |  | 61 | 67 | 102 | 160 | 20 |
| 17 |  |  |  | 4 | 46 | 51 | 150 | 51 |
| 18 |  |  |  | 57 | 0 | 72 | 20 | 8 |
| 19 |  |  |  | 1 | 74 | 27 | 62 | 77 |
| 20 |  |  |  | 30 | 38 | 107 | 240 | 385 |
| 21 |  |  |  | 58 | 36 | 33 | 220 | 422 |
| 22 |  |  |  | 35 | 124 | 110 | 42 | 434 |
| 23 |  |  |  | 40 | 61 | 29 | 235 | 509 |
| 24 |  |  |  | 7 | 48 | 28 | 21 | 168 |
| 25 |  |  |  | 3 | 112 | 94 | 58 | 273 |
| 26 |  |  |  | 6 | 111 | 105 | 10 | 81 |
| 27 |  |  |  | 41 | 87 | 5 | 119 | w465 |
| 28 |  |  |  | 18 | 49 | 63 | 115 | 219 |
| 29 |  |  |  | 28 | 125 | 16 | 61 | 319 |
| 30 |  |  |  | 32 | 44 | 64 | 176 | 177 |
| 31 |  |  |  | 48 | 93 | 81 | 228 | 140 |
| 32 |  |  |  |  |  | 41 | 107 | 60 |
| 33 |  |  |  |  |  | 112 | 14 | 288 |
| 34 |  |  |  |  |  | 96 | 87 | 68 |
| 35 |  |  |  |  |  | 100 | 125 | 80 |
| 36 |  |  |  |  |  | 124 | 24 | 183 |
| 37 |  |  |  |  |  | 4 | 254 | 293 |
| 38 |  |  |  |  |  | 7 | 179 | 121 |
| 39 |  |  |  |  |  | 45 | 127 | 136 |
| 40 |  |  |  |  |  | 10 | 33 | 96 |
| 41 |  |  |  |  |  | 74 | 149 | 186 |
| 42 |  |  |  |  |  | 111 | 226 | 269 |
| 43 |  |  |  |  |  | 84 | 36 | 150 |
| 44 |  |  |  |  |  | 20 | 80 | 335 |
| 45 |  |  |  |  |  | 75 | 109 | 138 |
| 46 |  |  |  |  |  | 26 | 11 | 41 |
| 47 |  |  |  |  |  | 117 | 133 | 144 |
| 48 |  |  |  |  |  | 93 | 210 | 202 |
| 49 |  |  |  |  |  | 103 | 117 | 218 |
| 50 |  |  |  |  |  | 0 | 30 | 357 |
| 51 |  |  |  |  |  | 66 | 40 | 238 |
| 52 |  |  |  |  |  | 78 | 138 | 22 |
| 53 |  |  |  |  |  | 92 | 79 | 299 |
| 54 |  |  |  |  |  | 37 | 16 | 297 |
| 55 |  |  |  |  |  | 91 | 216 | 468 |
| 56 |  |  |  |  |  | 71 | 198 | 24 |
| 57 |  |  |  |  |  | 40 | 143 | 161 |
| 58 |  |  |  |  |  | 43 | 248 | 328 |
| 59 |  |  |  |  |  | 38 | 69 | 237 |
| 60 |  |  |  |  |  |  |  |  |
| 61 |  |  |  |  |  | 87 | 104 | 14 |
| 62 |  |  |  |  |  | 50 | 203 |  |

While the invention herein disclosed has been described by means of specific embodiments and applications thereof, numerous modifications and variations could be made thereto by those skilled in the art without departing from the scope of the invention set forth in the claims.

For example, in the preferred embodiments, the constituent permutations applied within each row of the interleaver matrix were based on discrete logarithms in a Galois field. It is clear that this is only a particular example of a broad class of permutations based on Galois field arithmetic, which may be employed in accordance herewith. Optimally, another closely related choice would be to take a non-primitive element $\beta \in GF(C)$ of multiplicative order $ord(\beta)$ and define $$\pi_i(j) = \log(\beta^{i_o} + \beta^j), (j=0,1,2,\ldots,ord(\beta)-1)$$

to produce a constituent permutation of length $ord(\beta)-1$. Alternatively, a logarithm of a different linear or affine function of $\beta^j$ may be employed. More generally, one could take permutation mapping data at position $i=0, 1, 2, \ldots, ord(\beta)-1$ to a new position $$\pi_i(j) = f(\beta^j),$$

wherein f is any integer-valued function acting on finite field GF(C) and $\beta$ is a non-zero element in GF(C) of multiplicative order $ord(\beta)$.

In yet another alternative embodiment, the finite field(s) need not be binary-that is C need not be a power of 2.

What is claimed is:

1. A method for constructing an interleaver for interleaving blocks of indexed data having indices, the blocks having a varying length, the method comprising:
   determining at least one value based on a desired interleaver size; and
   utilizing the determined at least one value to construct an interleaver comprising one or more permutations of the indexed data, wherein constructing the interleaver comprises:
      determining a first index according to the at least one value;
      comparing the first index to a desired range of the interleaver size, and
      constructing the interleaver using the first index if the first index is within the desired range and constructing the interleaver using a second index selected according to the at least one value if the first index is outside the desired range.

2. The method of claim 1, wherein the desired interleaver size is selected among a plurality of interleaver sizes.

3. The method of claim 1, wherein the at least one value is associated with determining an interleaving pattern of the desired interleaver.

4. A method for constructing an interleaver for interleaving blocks of indexed data having indices, the method comprising:
   determining at least one value based on a desired interleaver size;
   utilizing the determined at least one value to construct an interleaver comprising one or more permutations of the indexed data;
   providing a turbo encoder comprising at least two connected constituent encoders; and
   interleaving the blocks of indexed data with the turbo encoder.

5. A method of interleaving blocks of indexed data having indices, the blocks having a varying length, the method including the steps of:
   providing a set of basic interleavers comprising a family of one or more permutations of the indexed data X(t) and having a variable length;
   selecting one of the basic interleavers based upon a desired interleaver length L; and
   adapting the selected basic interleaver to produce an interleaver having the desired interleaver length L,
   wherein the step of adapting the selected basic interleaver includes deleting indexed data having indices higher than the desired interleaver length L.

6. The method of claim 5, wherein the step of selecting includes:
   identifying a group of the basic interleavers having a length greater than or equal to the desired interleaver length L; and
   selecting one of the basic interleavers having a selected length which is smallest among the identified group of basic interleavers.

7. The method of claim 6, wherein the family of basic interleavers consists of "two-dimensional permutations" and further comprising the steps of:
   computing the "two-dimensional permutations", including the steps of:
      writing the indexed data into an interleaver matrix having one or more rows R in each of two dimensions;
      permuting the indexed data in the one or more rows in at least one of the two dimensions, to produce constituent permutations, said constituent permutations possibly being different from one row to another row in each of the two dimensions; and
      reading out the indexed data from the interleaver matrix.

8. The method of claim 7, further including the steps of:
   providing an interleaver device for the interleaving blocks of indexed data, the interleaver device further comprising a memory device for storing descriptions of the basic interleavers; and
   storing the descriptions of the basic interleavers in the memory device.

9. The method of claim 8, wherein the constituent permutations are pseudo-random permutations described by mathematical operations involving a limited number of parameters, wherein an amount of storage required for storing the limited number of parameters is less than another amount of storage required for storing a vector representation of a totality of permuted indices of the constituent permutations.

10. The method of claim 9, further including the step of:
    providing a turbo code encoder comprising two or more constituent code encoders connected together and to the interleaver device; and
    turbo encoding the indexed data after the interleaving by the interleaver device of the turbo code encoder.

11. A system for interleaving and turbo encoding blocks of indexed data, having indices, the blocks having a varying length, the system comprising:
    a parallel concatenation of two or more constituent encoders for recursive convolutional codes; and
    an interleaver device coupled to the parallel concatenation of the two or more constituent encoders,
    wherein the interleaver device defines a set of basic interleavers comprising a family of one or more permutations of the indexed data X(t) and having a variable length, and
    wherein the interleaver device is configured to:
      select one of the basic interleavers based upon a desired interleaver length L; and
      adapt the selected basic interleaver to produce an interleaver having the desired interleaver length L by deleting indexed data having indices higher than the desired interleaver length L.

12. A method of interleaving blocks of indexed data having indices, the blocks having a varying length, the method including the steps of:
    providing a set of basic interleavers comprising a family of one or more permutations of the indexed data X(t) and having a variable length;
    selecting one of the basic interleavers based upon a desired interleaver length L; and
    adapting the selected basic interleaver to produce an interleaver having the desired interleaver length L,
    wherein the step of adapting the selected basic interleaver includes deleting indexed data having indices higher than the desired interleaver length L,
    wherein the family of basic interleavers consists of "two-dimensional permutations" and the method further comprises the steps of:
    computing the "two-dimensional permutations", including the steps of:
      writing the indexed data into an interleaver matrix having one or more rows R in each of two dimensions;
      permuting the indexed data in the one or more rows in at least one of the two dimensions, to produce constituent permutations, said constituent permutations possibly being different from one row to another row in each of the two dimensions; and
      reading out the indexed data from the interleaver matrix.

13. The method of claim 12, wherein the step of selecting includes:
 identifying a group of the basic interleavers having a length greater than or equal to the desired interleaver length L; and
 selecting one of the basic interleavers having a selected length which is smallest among the identified group of basic interleavers.

14. The method of claim 13, further including the steps of:
 providing an interleaver device for the interleaving blocks of indexed data, the interleaver device further comprising a memory device for storing descriptions of the basic interleavers; and
 storing the descriptions of the basic interleavers in the memory device.

15. The method of claim 14, wherein the constituent permutations are pseudo-random permutations described by mathematical operations involving a limited number of parameters, wherein an amount of storage required for storing the limited number of parameters is less than another amount of storage required for storing a vector representation of a totality of permuted indices of the constituent permutations.

16. The method of claim 15, further including the step of:
 providing a turbo code encoder comprising two or more constituent code encoders connected together and to the interleaver device; and
 turbo encoding the indexed data after the interleaving by the interleaver device of the turbo code encoder.

17. A system for interleaving and turbo encoding blocks of indexed data, having indices, the blocks having a varying length, the system comprising:
 a parallel concatenation of two or more constituent encoders for recursive convolutional codes; and
 an interleaver device coupled to the parallel concatenation of the two or more constituent encoders,
 wherein the interleaver device defines a set of basic interleavers comprising a family of one or more permutations of the indexed data X(t) and having a variable length, and
 wherein the interleaver device is configured to:
 select one of the basic interleavers based upon a desired interleaver length L; and
 adapt the selected basic interleaver to produce an interleaver having the desired interleaver length L by deleting indexed data having indices higher than the desired interleaver length L,
 wherein the family of basic interleavers consists of "two-dimensional permutations", and wherein the interleaver device is further configured to:
 compute the "two-dimensional permutations", including:
 writing the indexed data into an interleaver matrix having one or more rows R in each of two dimensions;
 permuting the indexed data in the one or more rows in at least one of the two dimensions, to produce constituent permutations, said constituent permutations possibly being different from one row to another row in each of the two dimensions; and
 reading out the indexed data from the interleaver matrix.

18. A method of interleaving blocks of indexed data having indices, the blocks having a varying length, the method including the steps of:
 providing a set of basic interleavers comprising one or more permutations of the indexed data, each having a variable length;
 selecting one of the basic interleavers based upon a desired interleaver length L, wherein the selected interleaver has the shortest length which is greater than or equal to the desired interleaver length; and
 adapting the selected basic interleaver to produce a new interleaver having the desired interleaver length L,
 wherein the selected basic interleaver defines mappings, each of which is of a position of indexed data to a new mapped position, and
 wherein a mapping of the selected basic interleaver is retained if the position of indexed data in the selected basic interleaver is less than L and the mapping is rejected if the position of indexed data in the selected basic interleaver is not less than L.

19. The method of claim 18, wherein the position of indexed data starts from 0.

20. The method of claim 18, wherein the set of basic interleavers comprises two-dimensional permutations and further comprising computing the two-dimensional permutations by:
 writing the indexed data into an interleaver matrix having one or more rows in each of two dimensions;
 permuting the indexed data in the one or more rows in at least one of the two dimensions to produce constituent permutations; and
 reading out the indexed data from the interleaver matrix.

21. The method of claim 20, further comprising:
 providing an interleaver device for interleaving blocks of indexed data, the interleaver device comprising a memory device for storing descriptions of the basic interleavers; and
 storing the descriptions of the basic interleavers in the memory device.

22. The method of claim 21, wherein the constituent permutations are pseudo-random permutations described by mathematical operations involving a limited number of parameters, wherein an amount of storage required for storing the limited number of parameters is less than another amount of storage required for storing a vector representation of a totality of permuted indices of the constituent permutations.

23. The method of claim 20, wherein said constituent permutations are different from one row to another row in each of the two dimensions.

24. The method of claim 23, further comprising:
 providing an interleaver device for interleaving the blocks of indexed data, the interleaver device comprising a memory device for storing descriptions of the basic interleavers; and
 storing the descriptions of the basic interleavers in the memory device.

25. The method of claim 24, wherein the constituent permutations are pseudo-random permutations described by mathematical operations involving a limited number of parameters, wherein an amount of storage required for storing the limited number of parameters is less than another amount of storage required for storing a vector representation of a totality of permuted indices of the constituent permutations.

26. A system for interleaving and turbo encoding blocks of indexed data, having indices, the blocks having a varying length, the system comprising:
 a parallel concatenation of two or more constituent encoders for recursive convolutional codes; and
 an interleaver device coupled to the parallel concatenation of the two or more constituent encoders, for performing the steps of:
 accessing stored descriptions of basic interleavers, the basic interleavers comprising a family of one or more permutations of the indexed data and each having a variable length;
 identifying a group of the basic interleavers having a length greater than or equal to a desired interleaver length L;

selecting one of the basic interleavers having a length which is smallest among the group of the basic interleaves, the selected interleaver having the shortest length which is greater than or equal to the desired interleaver length; and adapting the selected one of the basic interleavers to produce a new interleaver having the desired interleaver length L, wherein the selected basic interleaver defines mappings of a position of indexed data to a new position, wherein for each mapping, the mapping of the selected basic interleaver is retained if the indexed position in the selected basic interleaver is less than L, otherwise the mapping is rejected.

27. A method of interleaving blocks of indexed data having indices, the blocks having a varying length, the method comprising:

providing a set of basic interleavers comprising a family of one or more permutations of the indexed data, each of the basic interleavers having a variable length;

selecting one of the basic interleavers, $I_2^m$, having a size $2^m$ based upon a desired interleaver length L, such that $2m-1 < L < 2m$; and adapting the selected one of the basic interleavers to produce an interleaver, $I_L$, having the desired interleaver length L, wherein adapting the selected one of the basic interleavers comprises for j=0 to $2^{L-1}$ and i=0 to $2^{L-1}$:

setting $I_L^{-1}(i)$ if $I_{2^m}^{-1}(j)$; and rejecting $I_L^{-1}(i)$ if $I_{2^m}^{-1}(j) \geq L$.

28. The method of claim 27, wherein the set of basic interleavers comprises two-dimensional permutations and further comprising computing the two-dimensional permutations by:

writing the indexed data into an interleaver matrix having one or more rows in each of two dimensions;

permuting the indexed data in the one or more rows in at least one of the two dimensions to produce constituent permutations; and reading out the indexed data from the interleaver matrix.

29. The method of claim 28, further comprising:

providing an interleaver device for interleaving the blocks of indexed data, the interleaver device comprising a memory device for storing descriptions of the basic interleavers; and storing the descriptions of the basic interleavers in the memory device.

30. The method of claim 29, wherein the constituent permutations are pseudo-random permutations described by mathematical operations involving a limited number of parameters, wherein an amount of storage required for storing the limited number of parameters is less than another amount of storage required for storing a vector representation of a totality of permuted indices of the constituent permutations.

31. The method of claim 28, wherein said constituent permutations are different from one row to another row in each of the two dimensions.

32. The method of claim 31, further comprising:

providing an interleaver device for interleaving the blocks of indexed data, the interleaver device comprising a memory device for storing descriptions of the basic interleavers; and storing the descriptions of the basic interleavers in the memory device.

33. The method of claim 32, wherein the constituent permutations are pseudo-random permutations described by mathematical operations involving a limited number of parameters, wherein an amount of storage required for storing the limited number of parameters is less than another amount of storage required for storing a vector representation of a totality of permuted indices of the constituent permutations.

* * * * *